United States Patent
Ogawa

(10) Patent No.: US 10,230,217 B2
(45) Date of Patent: Mar. 12, 2019

(54) SEMICONDUCTOR LASER DIODE HAVING MULTI-QUANTUM WELL STRUCTURE

(71) Applicant: SUMITOMO ELECTRIC DEVICE INNOVATIONS, INC., Yokohama-shi, Kanagawa (JP)

(72) Inventor: Naoki Ogawa, Yokohama (JP)

(73) Assignee: SUMITOMO ELECTRIC DEVICE INNOVATIONS, INC., Kanagawa (JP)

( * ) Notice: Subject to any disclaimer, the term of this patent is extended or adjusted under 35 U.S.C. 154(b) by 0 days.

(21) Appl. No.: 15/797,707

(22) Filed: Oct. 30, 2017

(65) Prior Publication Data

US 2018/0123320 A1    May 3, 2018

(30) Foreign Application Priority Data

Oct. 31, 2016    (JP) .................. 2016-213567

(51) Int. Cl.
| | |
|---|---|
| H01S 5/343 | (2006.01) |
| H01S 5/02 | (2006.01) |
| H01S 5/026 | (2006.01) |
| H01S 5/227 | (2006.01) |
| H01S 5/12 | (2006.01) |
| H01S 5/22 | (2006.01) |
| H01S 5/30 | (2006.01) |
| H01S 5/34 | (2006.01) |

(52) U.S. Cl.
CPC ........ *H01S 5/34313* (2013.01); *H01S 5/0206* (2013.01); *H01S 5/026* (2013.01); *H01S 5/2275* (2013.01); *H01S 5/34306* (2013.01); *H01S 5/34366* (2013.01); *H01S 5/1231* (2013.01); *H01S 5/2226* (2013.01); *H01S 5/305* (2013.01); *H01S 5/3054* (2013.01); *H01S 5/3406* (2013.01); *H01S 5/3407* (2013.01)

(58) Field of Classification Search
CPC ............. H01S 5/34313; H01S 5/34366; H01S 5/0206; H01S 5/026

See application file for complete search history.

(56) References Cited

U.S. PATENT DOCUMENTS

| | | | |
|---|---|---|---|
| 6,978,055 B2 | 12/2005 | Miyazaki | |
| 2014/0269807 A1* | 9/2014 | Matsui | H01S 5/06256 372/99 |

FOREIGN PATENT DOCUMENTS

| | | |
|---|---|---|
| JP | 2001-168471 | 6/2001 |
| JP | 2003-255286 | 9/2003 |

* cited by examiner

*Primary Examiner* — Dung T Nguyen
(74) *Attorney, Agent, or Firm* — Smith, Gambrell & Russell, LLP

(57) ABSTRACT

A semiconductor laser diode (LD) having an optical grating is disclosed. The LD includes a lower cladding layer that buries the optical grating, an active layer, and an upper cladding layer. The active layer has a multi-quantum well (MQW) structure of barrier layers and well layers alternately arranged. The MQW structure further includes intermediate layers between the barrier layers and the well layers. The intermediate layers have a lattice constant between that of the barrier layers and that of the well layers. Each intermediate layer has a thickness thinner than 1 nm.

14 Claims, 9 Drawing Sheets

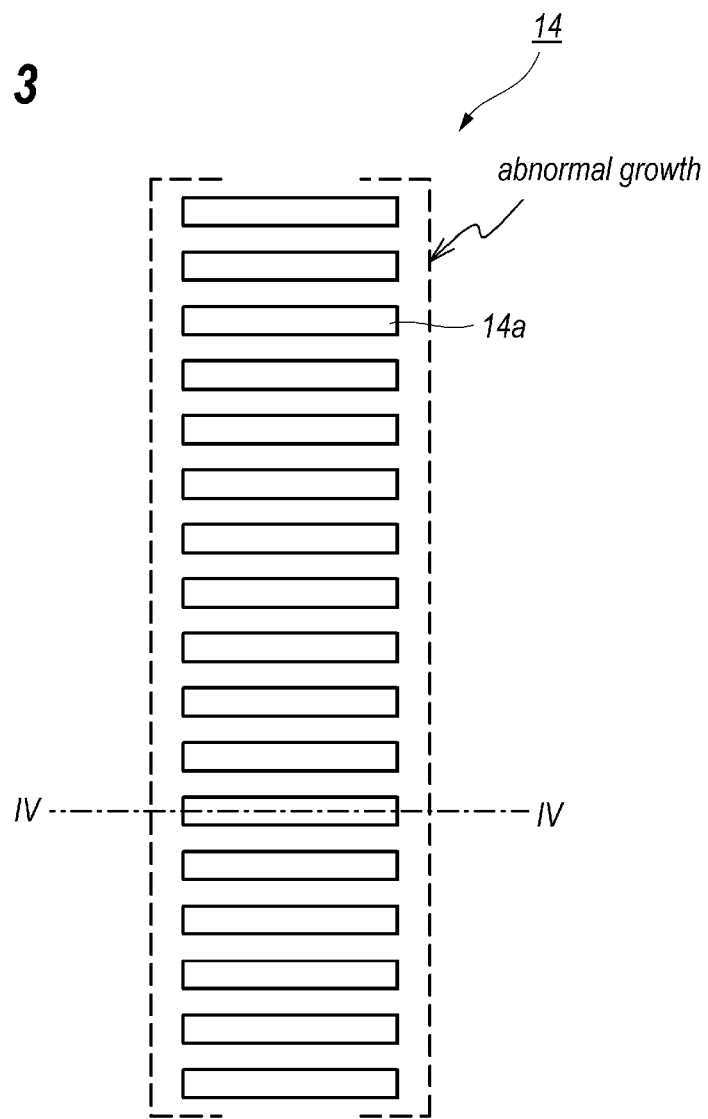

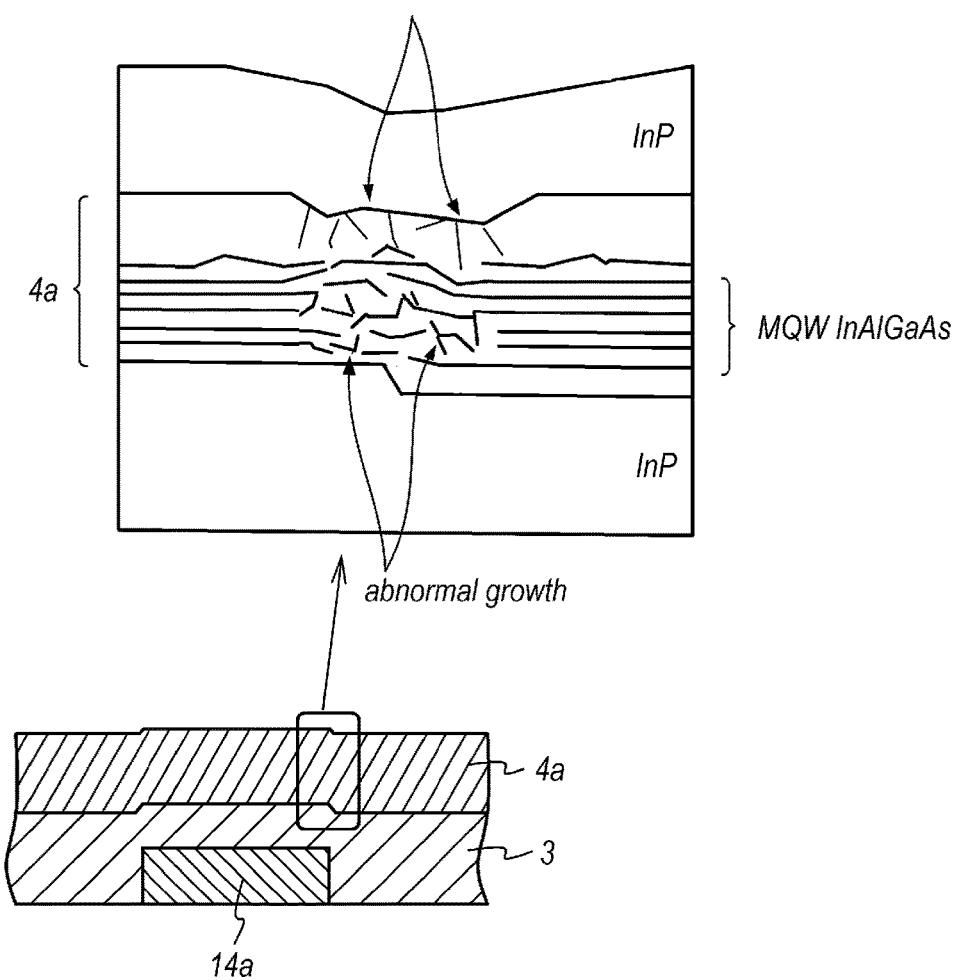

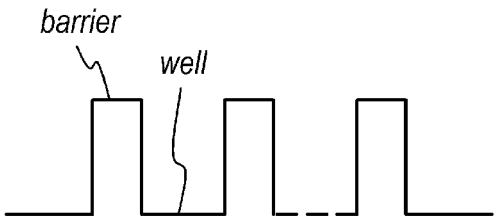
*Fig. 5A*
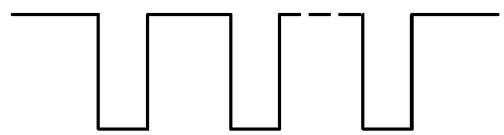
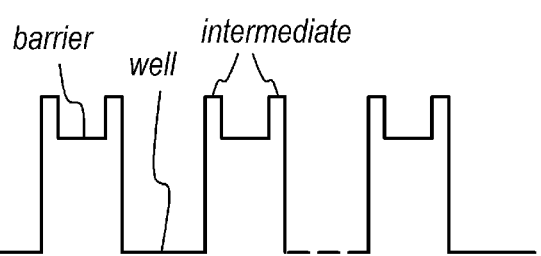
*Fig. 5B*
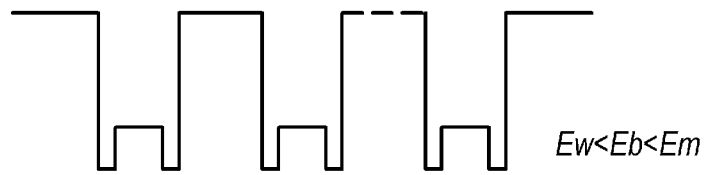
$Ew<Eb<Em$
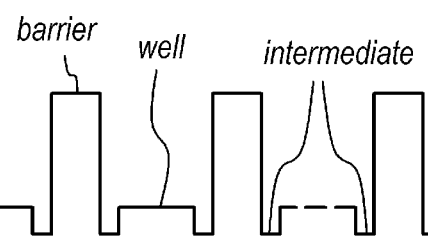
*Fig. 5C*
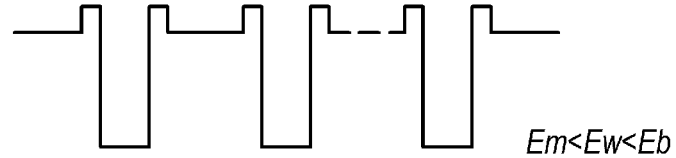
$Em<Ew<Eb$

SEMICONDUCTOR LASER DIODE HAVING MULTI-QUANTUM WELL STRUCTURE

BACKGROUND OF THE INVENTION

1. Field of the Invention

The present invention relates to a semiconductor laser diode (LD).

2. Related Background Art

A multi-quantum well (MQW) structure has been widely used in an active layer of a semiconductor laser diode (LD), a semiconductor optical modulator, and the like. A U.S. Pat. No. 6,978,055B has disclosed an MQW structure with intermediate layers between well layers and barrier layers. One type of an LD implements an optical grating below the active layer having the MQW structure. When the well layers and the barrier layers show a large lattice mismatching, the epitaxial growth of those layers becomes unable to compensate discontinuity of the optical grating, which may result in abnormal growth at edges of respective corrugations of the grating.

SUMMARY OF INVENTION

An aspect of the present invention relates to a semiconductor laser diode that includes a semiconductor substrate made of InP, an optical grating provided on the semiconductor substrate, an n-type layer, and an MQW active layer including barrier layers and well layers alternately stacked to each other. The n-type layer buries the optical grating therein. The barrier layers have tensile stress, while, the well layers have compressive stress. A feature of the present invention is that, the MQW active layer further includes a plurality of intermediate layers each between the barrier layers and the well layers. The intermediate layers have stresses between that of the barrier layers and that of the well layers; and have thickness thinner than 1 nm.

BRIEF DESCRIPTION OF THE DRAWINGS

The foregoing and other purposes, aspects and advantages will be better understood from the following detailed description of a preferred embodiment of the invention with reference to the drawings, in which:

FIG. 3 is a plan view of the optical grating;

FIG. 4 schematically shows a cross section of a region of a lateral edge of the corrugation of the optical grating;

FIG. 5A shows a band diagram with no intermediate layer, FIG. 5B shows the band diagram with the intermediate layer in a condition of Ew<Eb<Em, and FIG. 5C shows the band diagram with the intermediate layer in a condition of Em<Ew<Eb;

DESCRIPTION OF EMBODIMENT

Next, embodiment according to the present invention will be described as referring to drawings. In the description of the drawings, numerals or symbols same with or similar to each other will refer to elements same with or similar to each other without duplicating explanations.

First Embodiment

Figure 1A:
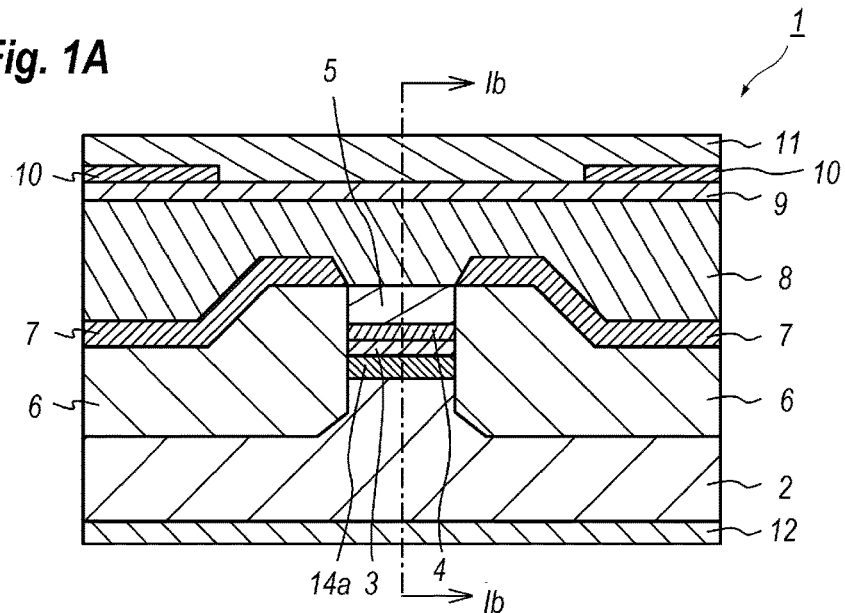
FIG. 1A shows a cross section viewed along an optical axis thereof.
Figure 1B:
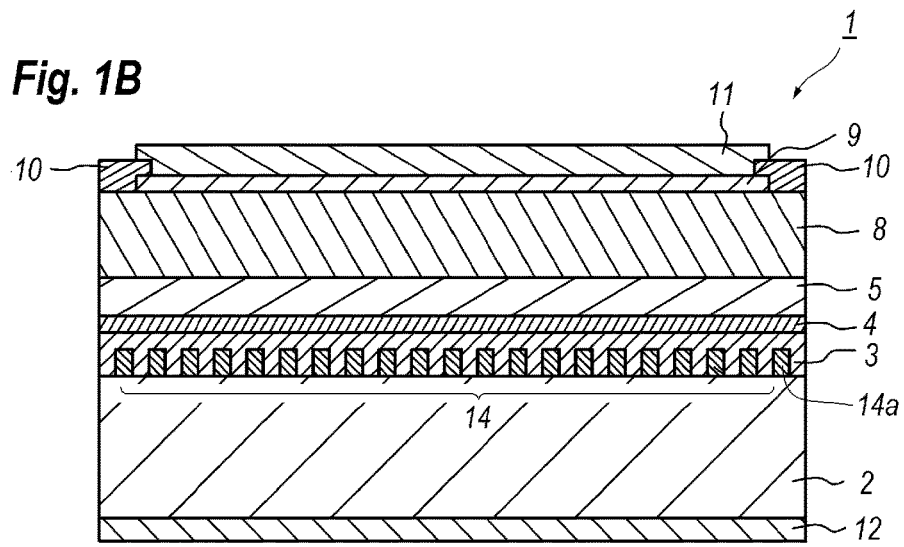
FIG. 1B shows another cross section along the optical axis.

FIG. 1A shows a cross section, which is viewed from direction along which laser light propagates, of a semiconductor laser diode (LD) 1 according to the first embodiment of the present invention; and FIG. 1B also shows a cross section of the LD 1 taken along the line IB-IB indicated in FIG. 1A. The LD 1 of the embodiment provides an n-type InP substrate 2, an n-type InP lower cladding layer 3, an active layer 4, a p-type InP upper cladding layer 5, a p-type InP blocking layer 6, an n-type InP blocking layer 7, a p-type InP layer 8, a contact layer 9, a passivation film 10, a p-type electrode 11, and an n-type electrode 12.

The n-type InP lower cladding layer 3, the active layer 4, and the p-type upper cladding layer 5 are stacked on the n-type InP substrate 2 in this order. Those layers of the n-type lower cladding layer 3, the active layer 4, and the p-type upper cladding layer 5 form a mesa with a height of, for instance, 2.0 μm.

The n-type InP substrate 2 is doped with silicon (Si) by density of $1.0 \times 10^{18}$ cm$^{-3}$. The n-type InP lower cladding layer 3 is also doped with Si by density of $1.0 \times 10^{18}$ cm$^{-3}$ and has a thickness of 0.5 μm. The active layer 4 has the MQW structure including InAlGaAs. Details of the active layer 4, or the MQW structure will be described later. The p-type InP upper cladding layer 5 may be doped with zinc (Zn) by density of $1.0 \times 10^{18}$ cm$^{-3}$ and has a thickness of 0.2 μm.

The n-type InP lower cladding layer 3 includes the optical grating 14 having corrugations periodically arranged by a preset pitch along the optical axis of the LD 1. The optical grating 14 includes InGaAsP with refractive index different from that of the n-type InP cladding layer. The corrugations have a height of, for instance, about 0.1 μm.

The p-type InP blocking layer and the n-type InP blocking layer are provided on the n-type InP substrate 2 so as to bury the mesa in respective sides thereof. The p-type InP blocking layer 6 is doped with Zn by density of $4.0 \times 10^{17}$ cm$^{-3}$ and has a thickness of 3.0 μm. The n-type InP blocking layer 7 may be doped with Si by density of $1.0 \times 10^{19}$ cm$^{-3}$ and has a thickness of 0.4 μm.

The p-type InP layer 8 and the p-type contact layer 9 covers the p-type upper cladding layer 5 and the n-type InP blocking layer 7, and grown thereon in this order. The p-type InP layer 8 is doped with Zn by density of $1.2 \times 10^{18}$ cm$^{-3}$ and has a thickness of 2.0 μm. The contact layer 9 may be made of InGaAs doped with Zn by density of $1.2 \times 10^{19}$ cm$^{-3}$ and has a thickness of 0.5 μm. The contact layer has bandgap energy smaller than that of the p-type InP layer 8. The p-type InP layer 8 may be operable as a part of the p-type upper cladding layer 5.

The passivation film 10 covers the contact layer 9 with an opening that over laps with the mesa. That is, the InGaAs contact layer 9 in a portion overlapping with the mesa exposes from the opening in the passivation film 10. The passivation film 10, which may be made of electrically insulating material, typically silicon oxide ($SiO_2$). The p-type electrode 11 covers the passivation film 11 and the InGaAs contact layer 9 exposing from the opening in the passivation film 11. The p-type electrode 11 may be an alloy of titanium (Ti), platinum (Pt), and gold (Au). The n-type electrode 12, which is provided in a back surface of the n-type InP substrate 2, may be made of eutectic metal of gold (Au), germanium (Ge), and nickel (Ni).

Figure 2:
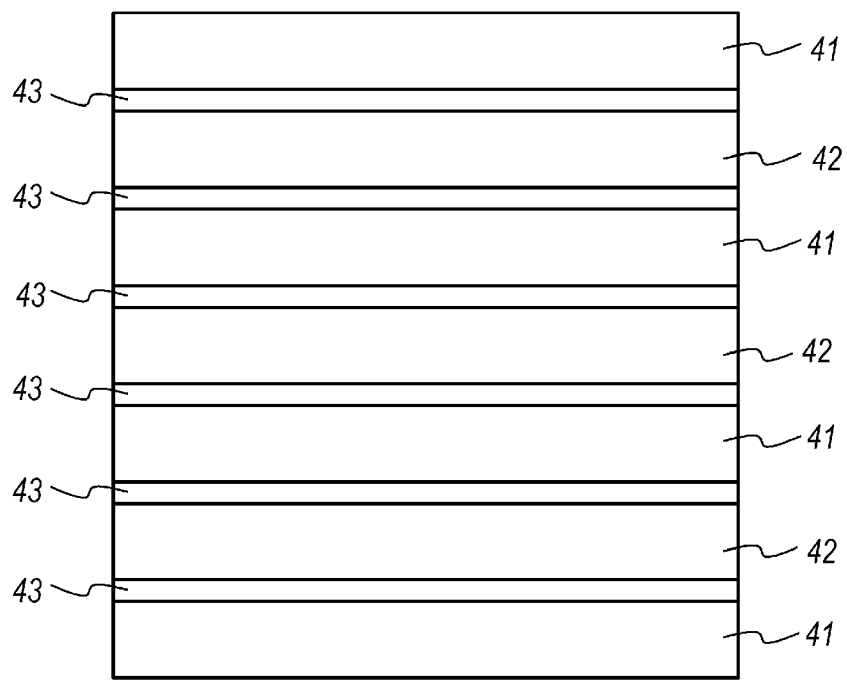
FIG. 2 schematically shows a multi-quantum well (MQW) structure in an active layer.

FIG. 2 magnifies the active layer 4 of the embodiment. The active layer 4 provides barrier layers 41 and well layers 42 alternately staked to each other, and further provides intermediate layers 43 between the barrier layers 41 and the well layers 42. One of the barrier layers 41 is in contact with the n-type InP lower cladding layer 3, while, another one of the barrier layers 41 is in contact with the p-type InP upper cladding layer 5. In the present embodiment, the barrier layers 41, the well layers 42, and the intermediate layer 43 are made of $InxAlyGa_{1-x-y}As$ but the compositions thereof are different from each other. The barrier layers 41 have tensile stress against the InP substrate 2, while, the well layers 42 show compressive stress against the InP substrate 2. The intermediate layers 43 show moderate stresses between the tensile stress in the barrier layers 41 and the compressive stresses in the well layers 42.

FIG. 3 is a plan view of the optical grating 14. The optical grating includes a plurality of corrugations 14a each having a rectangular plane shape with a lateral width greater than a width of the mesa. The corrugations 14a are disposed in an array along an optical axis of the LD 1 and a pitch of sub-micron meters. Because the pitch is so narrow, the n-type cladding layer 3 may securely bury gaps between the corrugations 14a, which makes the n-type lower cladding layer 3 in a top surface thereof flat. However, the top surface of the n-type cladding layer 3 leaves steps reflecting the lateral edges of respective rectangles. When the active layer 4, exactly, the barrier layers 41 and the well layers 42, is to be grown on thus stepped surface of the n-type cladding layer 3 without interposing the intermediate layers 43 between the barrier layers 41 and the well layers 42, an abnormal growth possibly occurs at regions corresponding to the lateral edges of the corrugations 14 reflecting a greater difference in the lattice constants between the barrier layers 41 and the well layers 42. FIG. 4 schematically shows a cross section of the region corresponding to the lateral edge of the corrugation 14a. As explained later of the present specification, the regions corresponding to the lateral edges of the corrugations 14a are to be removed as the formation of the mesa. However, the abnormal growth of the active layer 4 shown in FIG. 4 penetrates within a center region of the corrugations 14a; accordingly, influence of the abnormal growth is left in the active layer within the mesa.

The present embodiment provides the intermediate layers 43 between the barrier layers 41 and the well layers 42, where the intermediate layers 43 have stresses between that of the barrier layers 41 and that of the well layers 42. For instance, assuming that the barrier layers 41, the well layers, and the intermediate layers 43 are made of $InxAlyGa_{1-x-y}As$, and denoting the In composition of the barrier layers 41 as $x_b$, that of the well layers 42 as $x_w$, and that of the intermediate layers $x_m$, a relation of $x_b < x_m < x_w$ makes the difference in lattice constant between the barrier layers 41 and the intermediate layers 43, and that between the intermediate layers 43 and the well layers 43 smaller than the difference in lattice constant between the barrier layers 41 and the well layers 42 without interposing the intermediate layers 43. For instance, when the barrier layers 41 have a lattice constant smaller than −0.6% with respect to the InP substrate 2, or the InP cladding layer 3, which causes a tensile stress in the barrier layers 41, and the well layers 42 have a lattice constant greater than +1.7% also against the InP substrate 2 or the InP cladding layer 3, which causes a compressive stress in the well layers 42, the intermediate layers 43 preferably have a lattice constant greater than −0.6% but smaller than +1.7% against the InP substrate 2 or the InP cladding layer 3.

The inter mediate layers 43 having the lattice constant between that of the barrier layers 41 and that of the well layers 42 may alleviate stresses caused in the barrier layers 41 and the well layers 42. However, a thicker intermediate layer 43 excessively alleviates the stresses and suppresses advantages derived from the stresses such as emission efficiency, emission stability, and the like. Accordingly, the intermediate layers 43 are preferably thinner, for instance, thinner than 1 nm.

Also, a thicker intermediate layer 43 with bandgap energy close to that of the barrier layers 41 substantially operates as a barrier layer; while, a thicker intermediate layer 43 with bandgap energy close to that of the well layers 42 may cause recombination of carriers, which possibly widens a spectrum width of laser light.

As to the bandgap energy of the layers, denoting those of the barrier layers 41, the well layers 42, and the intermediate layers 43 as Eb, Ew, and Em, respectively; a relation of Ew<Eb<Em or Em<Ew<Eb is preferable. FIG. 5A shows a band diagram with no intermediate layer, FIG. 5B shows the band diagram with the relation of Ew<Eb<Em, and FIG. 5C shows the band diagram with the relation of Em<Ew<Eb.

In the former case, Ew<Eb<Em, for the band diagram, the compositions of the intermediate layers 43 may be closer to both of those of the barrier layers 41 and those of the well layers 42. Because the latter condition possibly increases the carrier recombination in the intermediate layers 43, the former case, that is, the compositions of the intermediate layers 43 are closer to those of the barrier layers 41. On the other hand, in the latter case, namely Em<Ew<Eb, the compositions of the intermediate layers 43 may be closer to the barrier layers 41. For instance, denoting Al composition of the barrier layers 41 as $y_b$, those of the well layers 42 as $y_w$, and those of the intermediate layers 43 as $y_m$, and further setting the compositions of the barrier layers 41 to be $x_b$=0.44 and $y_b$=0.28, which means the barrier layers 41 are $In_{0.44}Al_{0.28}Ga_{0.28}As$, and those of the well layers 42 to be $x_w$=0.79 and $y_w$=0.16, which means the well layers 42 are $In_{0.79}Al_{0.16}Ga_{0.05}As$; then the intermediate layers 42 preferably have the compositions of $x_m$=0.52 and $y_m$=0.48, namely $In_{0.52}Al_{0.48}As$, for the condition of Ew<Eb<Em, or compositions of $x_m$=0.53 and $y_m$=0, namely $In_{0.53}Ga_{0.47}As$, for the condition of Em<Ew<Eb.

Second Embodiment

Figure 6A:
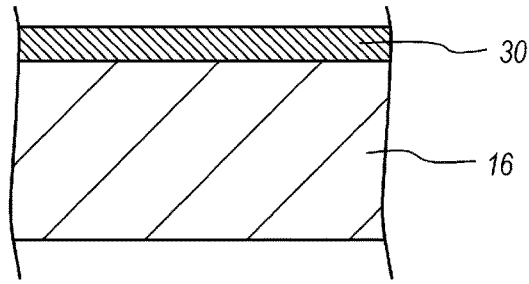
FIG. 6A show a process of forming the LD.
Figure 6B:
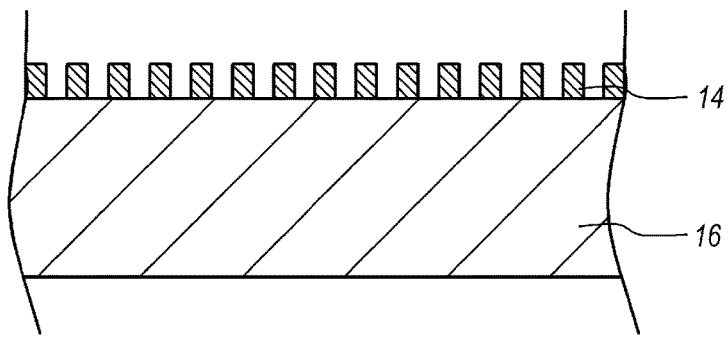
FIG. 6B show a process subsequent to the process shown in FIG. 6A, and FIG. 6C show the process subsequent to the process shown in FIG. 6B.

Next, a process of forming the LD will be described. First, a grating layer 30 is epitaxially grown on a semiconductor wafer 16 as shown in FIG. 6A. Then, a formation of a photoresist pattern on the grating layer 30 accompanied with a subsequent etching of the grating layer 30 with the photoresist pattern as an etching mask may form the corrugations 14 in the grating layer 30, as shown in FIG. 6B. The semiconductor wafer 16 operates as the n-type InP substrate 2 in the LD 1.

Then, the corrugations 14 are buried with the lower n-type cladding layer 3. The n-type lower cladding layer 3 may be doped with Si by a density of $1.0 \times 10^{18}$ $cm^{-3}$ and a thickness of, for instance, about 0.5 μm. Thereafter, the process epitaxially grows the active layer 4 on the n-type lower cladding layer 3. The active layer 4 is grown by the metal organic chemical vapor phase deposition (MOCVD) technique using tri-methyl-indium (TMI), tri-methyl-gallium (TMG), tri-methyl-aluminum (TMA), arsine ($AsH_3$), and phosphine ($PH_3$) for sources of indium (In), gallium (Ga), aluminum (Al), arsenic (As), and phosphorous (P), respectively. A growth pressure is, for instance, 10000 Pa and a growth temperature is 660~700° C. Flow rates of source gases are TMA=0.6 ccm (cc per minutes), TMG=0.5 ccm, and TMI=0.6 ccm for the barrier layers 41, and TMA=0.3 ccm, TMG=0.1 ccm, and TMI=1.3 ccm for the well layers 42. For the intermediate layers 43 in the condition of Ew<Eb<Em, the flow rates of the source gases are TMA=0.6 ccm and TMI=0.6 ccm; while, those for the other condition of Em<Ew<Eb are TMG=0.6 ccm and TMI=0.6 ccm. The flow rate of arsine ($AsH_3$) is 40 ccm for all layers and conditions. Under such conditions, the intermediate layers 43 show a growth rate of 0.2 nm/sec, that of the barrier layers 41 is 0.3 nm/sec, and that of the well layers 42 is 0.2 nm/sec; and growth times are 30 seconds, 15 seconds and 5 seconds for the barrier layers 41, the well layers 42, and the intermediate layers 43, respectively. A growth period shorter than 10 seconds may form the intermediate layers 43 thinner than 1 nm.

Figure 9:
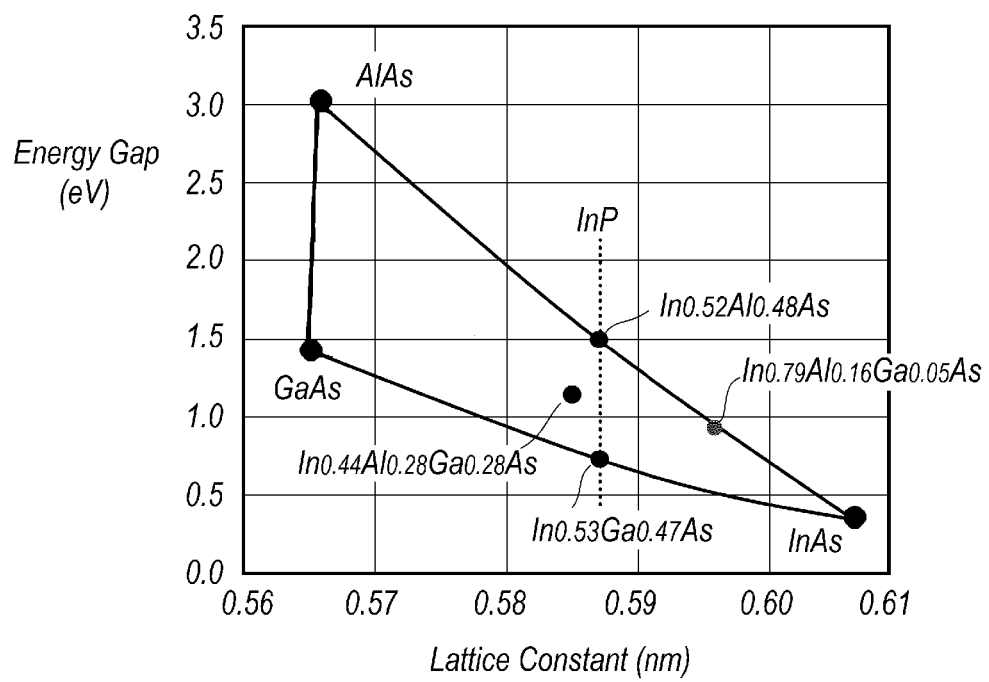
FIG. 9 shows a relation of lattice constants against energy bandgap of quaternary compound of $In_xAl_yGa_{1-x-y}As$.

FIG. 9 shows a relation of lattice constants against energy gap of a quaternary compound of $In_xAl_yGa_{1-x-y}As$. When a composition of $x_b$=0.44 and $y_b$=0.28 for the barrier layers 41, which corresponds to a compound of $In_{0.44}Al_{0.28}Ga_{0.28}As$, the compound shows bandgap energy of 1.18 eV, and another composition of $x_w$=0.79 and $y_w$=0.16 for the well layers 24, which corresponds to a compound of $In_{0.79}Al_{0.16}Ga_{0.05}As$ that has energy gap of 0.855 eV; the intermediate layers preferably have compositions of $x_m$=0.52 and $y_m$=0.48, which corresponds to InAlAs with bandgap energy of 1.48 eV, for the arrangement of Ew<Eb<Em, or $x_m$=0.53 and $y_m$=0, which corresponds to InGaAs with bandgap energy of 0.75 eV, for the arrangement of Em<Ew<Eb. Under such conditions, the inter intermediate layers 43 substantially match the lattice constant thereof with the lattice constant of InP, and the barrier layers 41 and the well layers 42 have the lattice constant shorter than that of InP and the lattice constant longer than that of InP, respectively. That is, the barrier layers 41 and the well layers 42 in the lattice constants thereof are placed in respective sides of the lattice constant of InP.

Figure 6C:
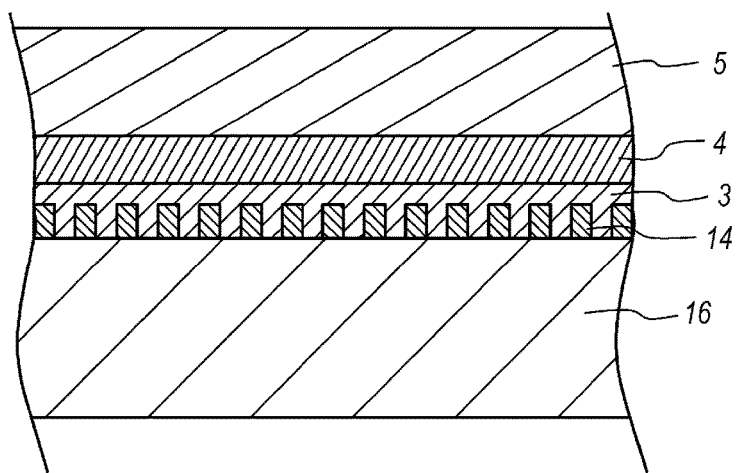
Figure 7A:
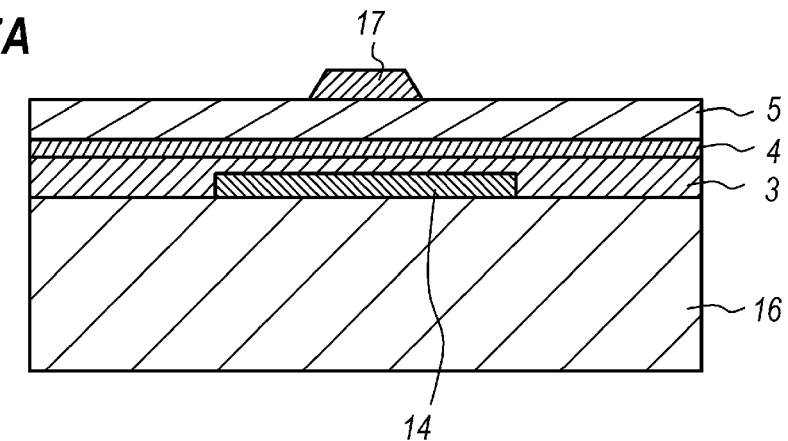
FIG. 7A shows a process of forming the LD, which is subsequent to the process shown in FIG. 6C.

Referring back to FIG. 6C, the process grows the p-type InP upper cladding layer 5 on the active layer 4, where the p-type InP cladding layer 5 is doped with Zn by density of $1.0 \times 10^{18}$ $cm^{-3}$ and has a thickness of 0.2 μm. Thereafter, as shown in FIG. 7A, a mask 17 is patterned on the p-type upper cladding layer 5 so as to form a stripe exposing edge portions of the corrugations 14 but cover a center portion thereof that is converted into a mesa stripe including the p-type upper cladding layer 4, the active layer 4, the n-type lower cladding layer 3, and a portion of the semiconductor substrate 2.

Figure 7B:
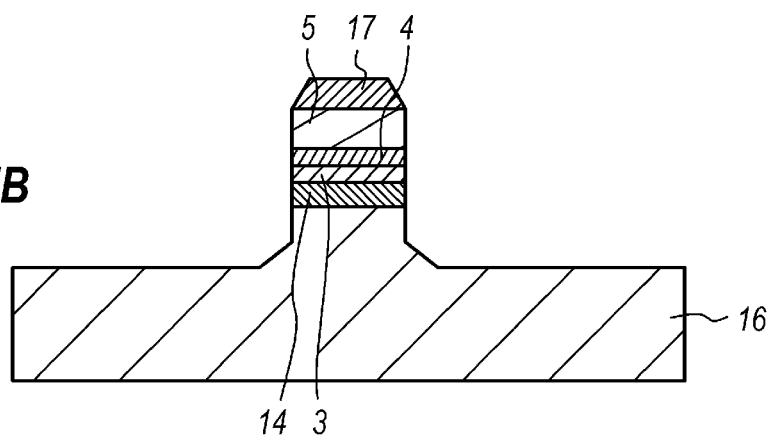
FIG. 7B shows a process subsequent to the process shown in FIG. 7B.

Then, as FIG. 7B shows, etching portions of the layers, 5 to 2, exposed from the patterned mask 17, the process may form the mesa. The mask 17 has a width of, for instance, 3 μm and a thickness of 0.5 μm made of silicon oxide ($SiO_2$), while, the corrugation 14 covered with the mask 17 has a width of, for instance, 10 μm.

Thereafter, the p-type cladding layer 5, the active layer 4, the n-type cladding layer 3, and a portion of the substrate 2 exposed from the mask 17 are sequentially etched using chlorine containing reactive gas, which forms a mesa on the semiconductor substrate 2. Thus, the mesa with a width and a height of about 2.0 μm and 1.5 μm, respectively, is formed.

Figure 7C:
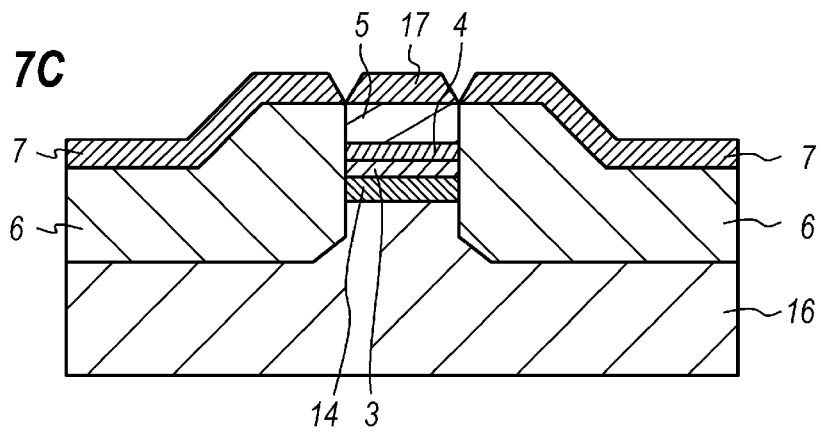
FIG. 7C shows a process subsequent to the process shown in FIG. 7B.

Then, as shown in FIG. 7C, the p-type InP burying layer 6 and the n-type InP burying layer 7 are sequentially and selectively grown on respective sides of the mesa. The p-type InP burying layer 6 is doped with Zn by density of $4.0 \times 10^{17}$ $cm^{-3}$ and has a thickness of 3.0 μm, while, the n-type InP burying layer 7 is doped with Si by density of $1.0 \times 10^{19}$ $cm^{-3}$ and has a thickness of 0.4 μm.

Removing the patterned mask 17, the process grows the p-type InP layer 8 on the mesa and the n-type burying layer 7. The grown p-type InP layer 8 may operate as a part of the p-type upper cladding layer 5. The p-type InP layer 8 may be doped with Zn by density of $1.2 \times 10^{18}$ $cm^{-3}$ and has a thickness of 2.0 μm.

Figure 8:
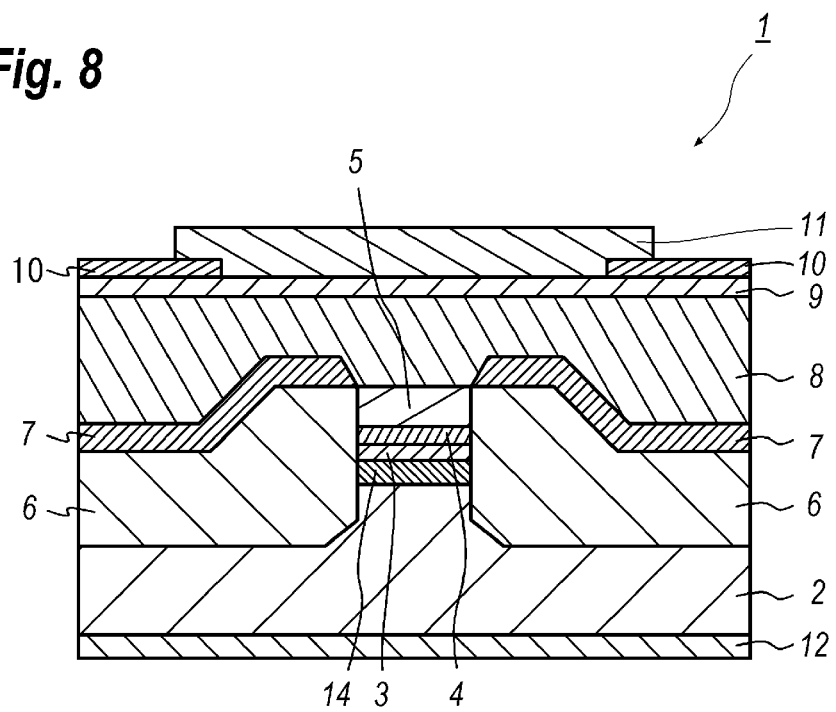
FIG. 8 shows a process of forming the LD, which is subsequent to the process shown in FIG. 7C.

Thereafter, the process grows the contact layer 9 on the p-type InP layer 8. The contact layer 9 may be made of p-type InGaAs doped with Zn and has a thickness of 0.5 μm. Covering the contact layer 9 with an insulating film 10 so as to expose a portion of the contact layer 9 above the mesa, and depositing a p-type electrode 11 so as to be in contact with the contact layer 9 exposed within an opening in the insulating film 10 and an n-type electrode 12 in a whole back surface of the semiconductor substrate 2. The insulating layer 10 may be made of, for instance, silicon oxide ($SiO2$). The p-type electrode 11 may be formed by allowing stacked metals of titanium (Ti), platinum (Pt), and gold (Au), while, the n-type electrode 12 may be made of eutectic meal of gold (Au), germanium (Ge), and nickel (Ni). Thus, the LD 1 of the present invention may be completed as shown in FIG. 8.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

The present application claims the benefit of priority of Japanese Patent Application No. 2016-213567, filed on Oct. 31, 2016, which is incorporated herein by reference.

I claim:

1. A semiconductor laser diode, comprising:
   a semiconductor substrate made of indium phosphide (InP);
   an optical grating provided on the semiconductor substrate;
   an n-type layer that buries the optical grating; and
   an active layer provided on the n-type layer, the active layer having an arrangement of a multi-quantum well (MQW) structure including a plurality of barrier layers and a plurality of well layers alternately stacked, the barrier layers having tensile stress and the well layers having compressive stress,
   wherein the MQW structure includes a plurality of intermediate layers, each of the intermediate layers being sandwiched between one of the barrier layers and one of the well layers, the intermediate layers having stress between the barrier layers and the well layers, and having a thickness thinner than 1 nm.

2. The semiconductor laser diode of claim 1, wherein the n-type layer is made of InP.

3. The semiconductor laser diode of claim 1, wherein the barrier layers are made of a semiconductor material with a lattice constant shorter than a lattice constant of InP and the well layers are made of a semiconductor material with a lattice constant longer than a lattice constant of InP, and wherein the intermediate layers are made of a semiconductor material with a lattice constant between the lattice constant of the barrier layers and the lattice constant of the well layers.

4. The semiconductor laser diode of claim 3, wherein the lattice constant of the intermediate layers is substantially equal to the lattice constant of InP.

5. The semiconductor laser diode of claim 1, wherein the intermediate layers have an energy bandgap greater than an energy bandgap of the barrier layers and an energy bandgap of the well layers.

6. The semiconductor laser diode of claim 5, wherein the intermediate layers have a lattice constant substantially equal to the lattice constant of InP.

7. The semiconductor laser diode of claim 1, wherein the intermediate layers have an energy bandgap smaller than an energy bandgap of the barrier layers and an energy bandgap of the well layers.

8. The semiconductor laser diode of claim 7, wherein the intermediate layers have a lattice constant substantially equal to the lattice constant of InP.

9. The semiconductor laser diode of claim 1, wherein the barrier layers, the well layers, and the intermediate layers are each made of InAlGaAs with compositions different from each other.

10. The semiconductor laser diode of claim 9, wherein the barrier layers are made of $In_{0.44}Al_{0.28}Ga_{0.28}As$ and the well layers are made of $In_{0.79}Al_{0.16}Ga_{0.05}As$.

11. The semiconductor laser diode of claim 1, wherein the barrier layers and the well layers are each made of InAlGaAs with different compositions.

12. The semiconductor laser diode of claim 11, wherein the barrier layers are made of $In_{0.44}Al_{0.28}Ga_{0.28}As$ and the well layers are made of $In_{0.79}Al_{0.16}Ga_{0.05}As$.

13. The semiconductor laser diode of claim 12, wherein the intermediate layers are made of InAlAs.

14. The semiconductor laser diode of claim 12, wherein the intermediate layers are made of InGaAs.

* * * * *